United States Patent [19]

Wen

[11] Patent Number: 5,554,568
[45] Date of Patent: Sep. 10, 1996

[54] POLYSILICON TRENCH AND BURIED POLYSILICON WALL DEVICE STRUCTURES

[75] Inventor: Jemmy Wen, Hsinchu, Taiwan

[73] Assignee: United Microelectronics Corporation, Hsin-Chu, Taiwan

[21] Appl. No.: 365,047

[22] Filed: Dec. 27, 1994

[51] Int. Cl.⁶ .............. H01L 21/44; H01L 21/48
[52] U.S. Cl. .............................. 437/203; 437/913
[58] Field of Search .................. 437/29, 40 DM, 437/41 DM, 913, 203, 52, 40 DM; 257/302, 328, 329, 330, 331, 332, 333, 334, 395, 396, 392, 398, 399

[56] References Cited

U.S. PATENT DOCUMENTS

| | | | |
|---|---|---|---|
| 4,520,552 | 6/1985 | Arnould et al. | 29/571 |
| 4,835,584 | 5/1989 | Lancaster | 357/23.1 |
| 4,963,502 | 10/1990 | Teng et al. | 437/52 |
| 5,111,257 | 5/1992 | Andoh et al. | 257/397 |
| 5,204,280 | 4/1993 | Dhong et al. | 437/52 |
| 5,293,512 | 3/1994 | Wen | 257/622 |

Primary Examiner—Mary Wilczewski
Assistant Examiner—Brian K. Dutton
Attorney, Agent, or Firm—William H. Wright

[57] ABSTRACT

This invention describes a device structure and a method of forming the device structure using trenches with sidewalls formed in the substrate of an integrated circuit. A highly doped polysilicon layer is formed on the walls of the trench or the trench is filled with highly doped polysilicon to form the source and drain of a field effect transistor in an integrated circuit. The invention provides reduced source and drain resistance. The capacitances between the gate and source and the gate and drain are reduced as well.

13 Claims, 6 Drawing Sheets

POLYSILICON TRENCH AND BURIED POLYSILICON WALL DEVICE STRUCTURES

BACKGROUND OF THE INVENTION (1). Field of the Invention

The invention relates to the use of trenches with walls formed in a semiconductor substrate. The trenches are then filled with highly doped polysilicon or a layer of highly doped polysilicon is formed on the trench walls to form the source and drain of a field effect transistor in an integrated circuit.

(2). Description of the Prior Art

In using field effect transistors in the formation of integrated circuits keeping source and drain resistances low has long been recognized as important. In addition it is important to keep the capacitance between the gate and source and between the source and drain as low as possible. These considerations become more important still as levels of integration increase and as circuit speeds increase.

This invention uses trenches in the semiconductor substrate to form source and drain areas which minimize source and drain resistance. The capacitance between gate and source and gate and drain are also minimized. U.S. Pat. No. 5,204,280 to Dhong et al shows a method for lithography for making trenches but for a different purpose than for this invention.

SUMMARY OF THE INVENTION

It is a principle object of the invention to provide a new device structure using a buried polysilicon wall as part of the source or drain of field effect transistors in high density integrated circuits.

It is a further object of the invention to provide a method of forming a new device structure using a buried polysilicon wall as part of the source or drain of a field effect transistor in an integrated circuit.

It is a further object of the invention to provide a new device structure using buried trenches filled with polysilicon as the source or drain of field effect transistors in high density integrated circuits.

It is a further object of the invention to provide a method of forming a new device structure using buried trenches filled with polysilicon as part of the source or drain of a field effect transistor in an integrated circuit.

These objectives are achieved by dry etching vertical trenches in a semiconductor substrate. A layer of highly doped polysilicon is then deposited on the walls of the trenches or the trenches are filled with highly doped polysilicon, N type polysilicon for a P type substrate and P type polysilicon for an N type substrate. The devices use a standard polysilicon gate structure. Reduced overlap area between the polysilicon gate structure and the source or drain substantially reduces the capacitance between the gate and source or drain and thereby provides increased circuit speed. The vertical trenches provide increased device density in the integrated circuit and reduces source and drain resistances to less than about 10 ohms per square. The trench structures provide shallow junction depth and low threshold voltage. The devices described in this invention can use standard polysilicon gate structures.

DESCRIPTION OF THE PREFERRED EMBODIMENTS

Figure 1:
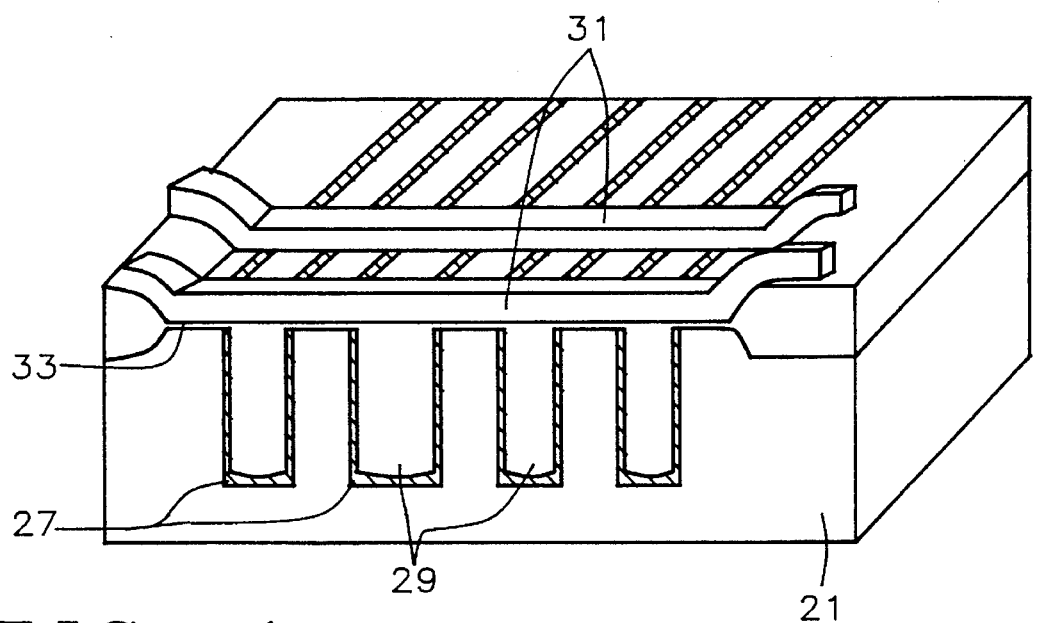
FIG. 1 shows a descriptive view of the buried polysilicon wall device structure.
Figure 2:
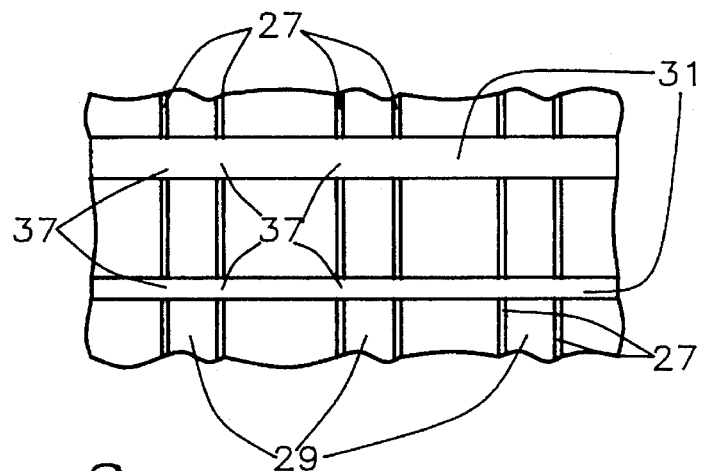
FIG. 2 shows a top view of the polysilicon wall device structure.

Refer now to FIG. 1 and FIG. 2, there is shown an embodiment of the buried polysilicon wall device structure. As shown in FIG. 1 vertical trenches between about 0.5 and 1.0 microns wide and between about 0.5 and 5.0 microns deep are formed in a silicon substrate 21. A layer of highly doped polysilicon 27, P type polysilicon for an N type substrate and N type polysilicon for a P type substrate, with a thickness between about 500 and 2000 Angstroms is formed on the walls of the trenches. The doping levels for the polysilicon are sufficient to give a polysilicon resistivity of less than 100 ohms per square. The remaining interior 29 of each trench is filled with a dielectric material such as $SiO_2$. A gate oxide 33 of $SiO_2$ with a thickness between about 50 and 200 Angstroms is formed over the source and drain area of the device. A polysilicon gate electrode 31 is formed over the gate oxide.

As shown in FIG. 2 the areas of overlap 37 between the polysilicon gate electrode 31 and the highly doped polysilicon vertical wall 27 is very small. This small overlap area greatly reduces the capacitance between the gate electrode and the source or drain areas of the device. The small capacitance increases circuit speed. Due to the large area of the trench wall the source and drain resistances are very small.

Figure 3:
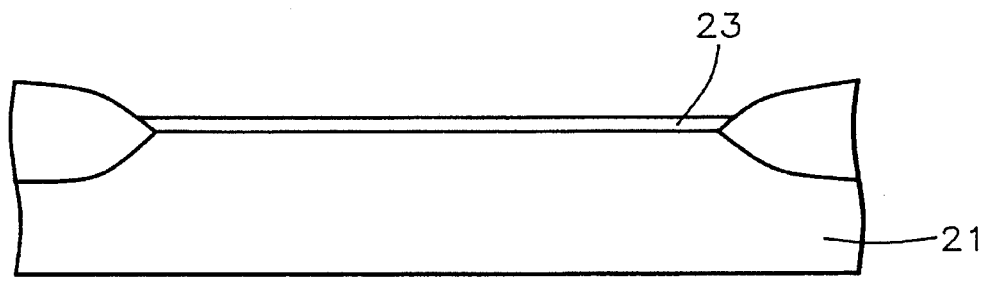
FIG. 3 shows a cross sectional view of the semiconductor substrate with the dielectric barrier layer formed on the semiconductor substrate.
Figure 4:
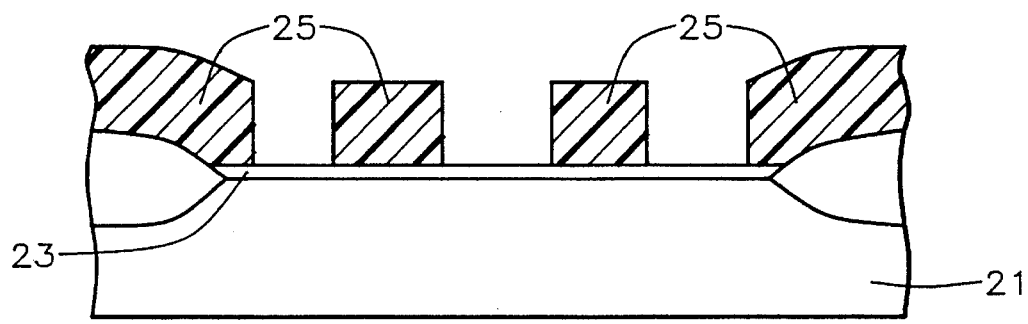
FIG. 4 shows a cross sectional view of the semiconductor substrate with source and drain areas formed in the photoresist layer.
Figure 5:
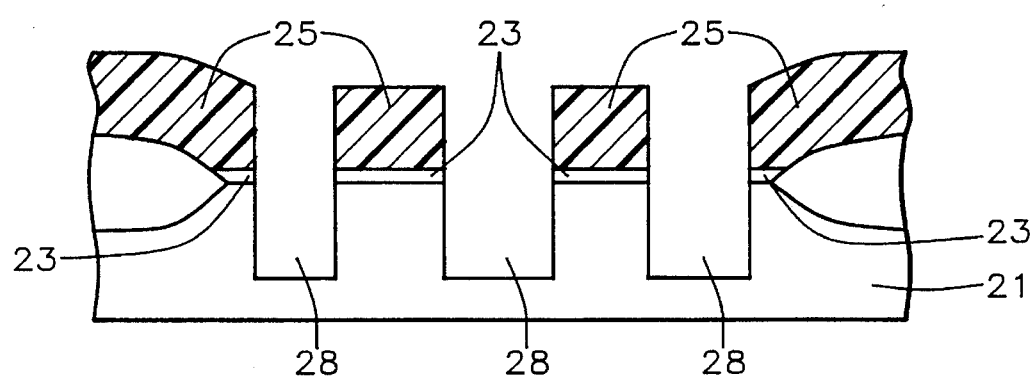
FIG. 5 shows a cross sectional view of the vertical trenches formed in the semiconductor substrate.
Figure 6:
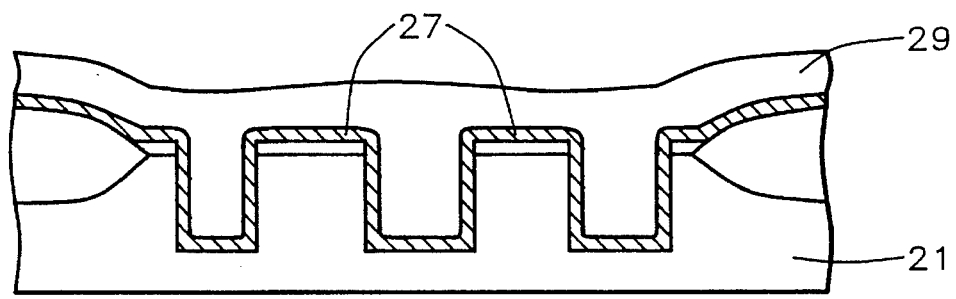
FIG. 6 shows a cross sectional view of the vertical trenches in the semiconductor substrate with a highly doped polysilicon layer formed on the walls of the trenches and a dielectric filling the trenches.

Refer now to FIG. 3 through FIG. 8, there is shown an embodiment of a method of forming the buried polysilicon wall device. FIG. 3 shows a barrier dielectric layer 23 of silicon dioxide having a thickness of between about 100 and 600 Angstroms formed on a silicon substrate 21. As shown in FIG. 4, a layer of photoresist 25 with openings formed for the source and drain is formed on the surface of the barrier dielectric layer 23. As shown in FIG. 5, trenches 28 are then etched through the barrier dielectric 23 into the silicon substrate 21 through the source and drain openings in the photoresist 25 using anisotropic etching. The trenches are between about 0.5 and 1.0 microns wide and between about 0.5 and 5.0 microns deep. As shown in FIG. 6 the photoresist is removed and a layer of highly doped polysilicon 27 with a thickness between about 500 and 2000 Angstroms is formed on the walls of the trenches and the surface of the silicon substrate 21 using Low Pressure Chemical Vapor Deposition. For an N type silicon substrate P type polysilicon with doping level sufficient to give a polysilicon resistivity of less than 100 ohms per square is used. For a P type silicon substrate N type polysilicon with doping level sufficient to give a polysilicon resistivity of less than 100 ohms per square is used. The polysilicon is then annealed at a temperature of between about 700° C. and 900° C. for between about 10 and 30 minutes. A dielectric 29 of silicon dioxide is then formed on the substrate surface filling the trenches by means of Low Pressure Chemical Vapor Deposition or Spin On Glass techniques.

Figure 7:
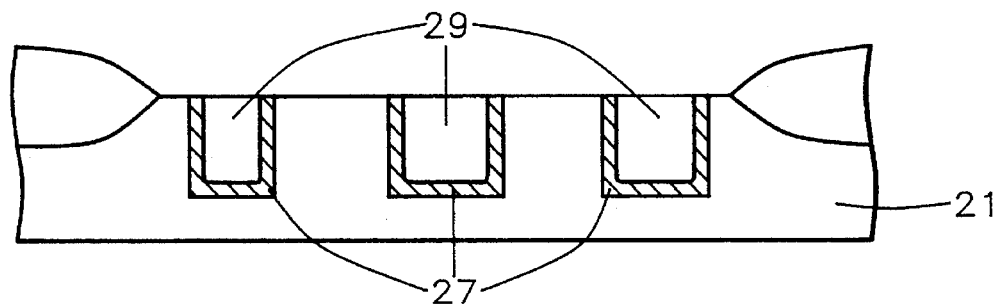
FIG. 7 shows a cross sectional view of the buried polysilicon wall device after removal of the dielectric barrier layer.
Figure 8:
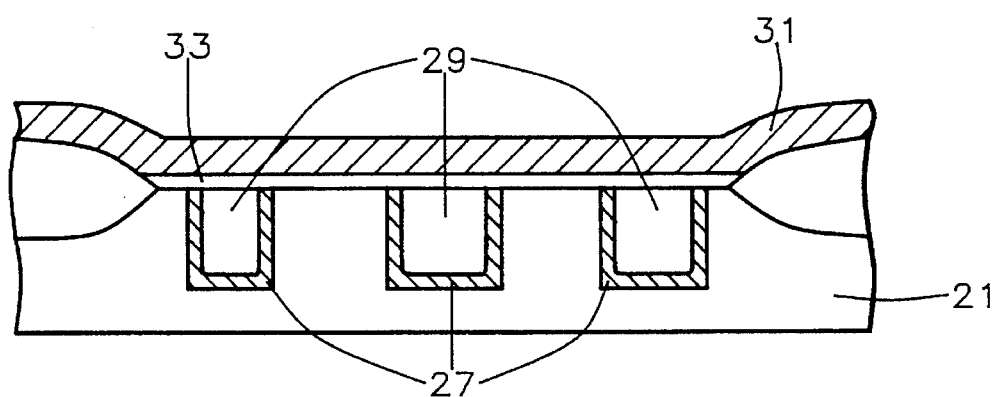
FIG. 8 shows a cross sectional view of the buried polysilicon wall device after forming the polysilicon gate.

As shown in FIG. 7 the dielectric, highly doped polysilicon, and barrier dielectric are removed from the surface of the substrate leaving the highly doped polysilicon layer 27 on the walls of the trenches and the dielectric filling the trenches. As shown in FIG. 8 a gate oxide 33 with a thickness between about 50 and 200 Angstroms is then formed over the area of the trenches and a polysilicon gate electrode 31 is formed on the gate oxide.

Figure 9:
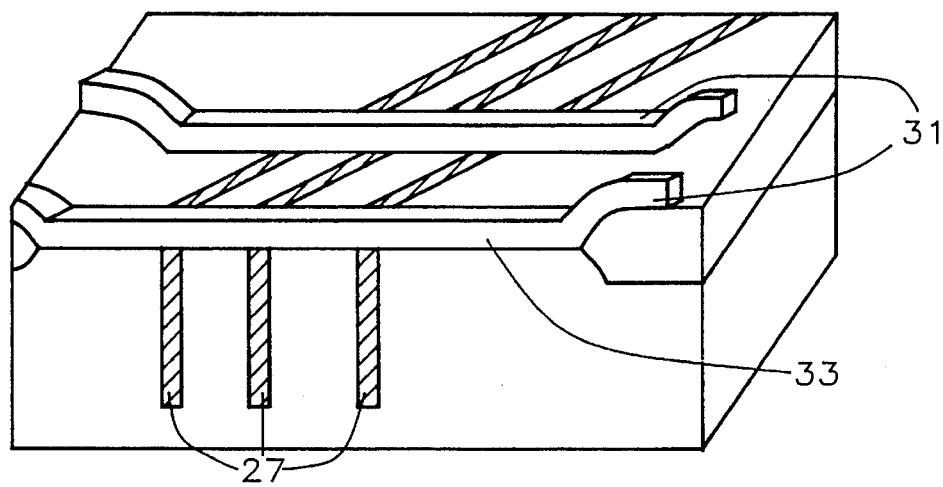
FIG. 9 shows a descriptive view of the buried polysilicon trench device.
Figure 10:
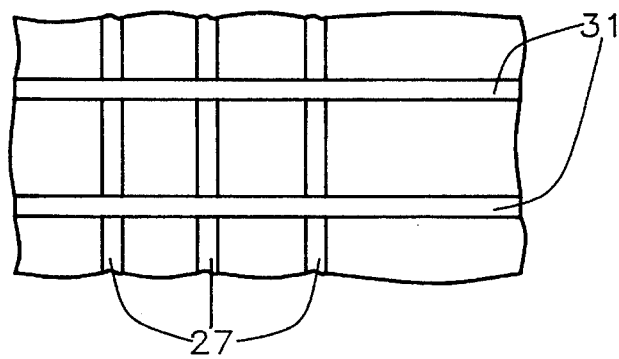
FIG. 10 shows the top view of the buried polysilicon trench device.

Refer now to FIG. 9 and FIG. 10, there is shown an embodiment of the polysilicon trench device structure. As shown in FIG. 9 vertical trenches between about 0.5 and 1.0 microns wide and between about 0.5 and 5.0 microns deep are formed in a silicon substrate 21. The vertical trenches are then filled with highly doped polysilicon 27, P type polysilicon for an N type substrate and N type polysilicon for a P type substrate, with a thickness between about 500 and 5000 Angstroms. The doping levels for the polysilicon is sufficient to provide polysilicon resistivity of less than 100 ohms per square for either P type or N type polysilicon. A gate oxide 33 of silicon dioxide with a thickness of between about 50 and 200 Angstroms is formed over the source and drain area of the device. A polysilicon gate electrode 31 is formed over the gate oxide.

As shown in FIG. 10 the areas of overlap between the polysilicon gate electrode 31 and the highly doped polysilicon in the trench 27 is very small. This small overlap area greatly reduces the capacitance between the gate electrode and the source or drain areas of the device. The small capacitance increases circuit speed. The source and drain resistances are very small due to the large area of the trench wall.

Figure 11:
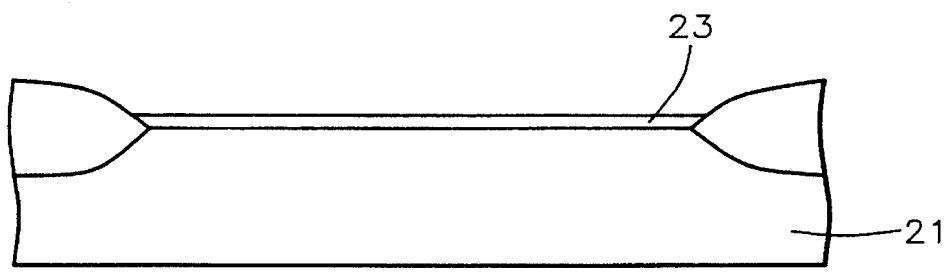
FIG. 11 shows a cross sectional view of the semiconductor substrate with the dielectric barrier layer formed on the semiconductor substrate.
Figure 12:
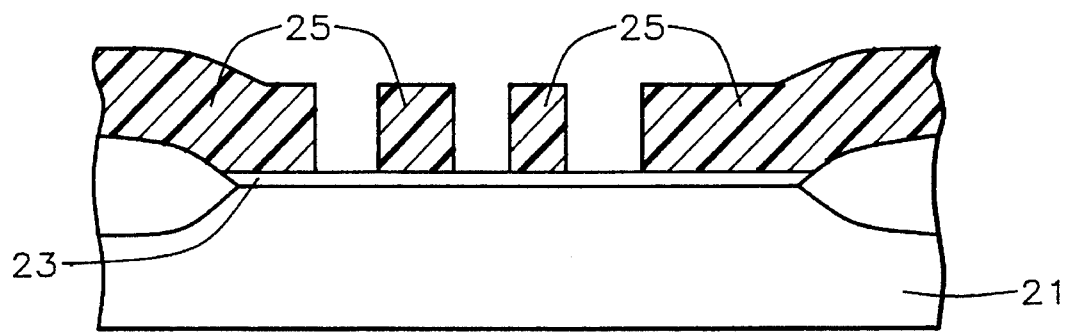
FIG. 12 shows a cross sectional view of the semiconductor substrate with source and drain areas formed in the photoresist layer.
Figure 13:
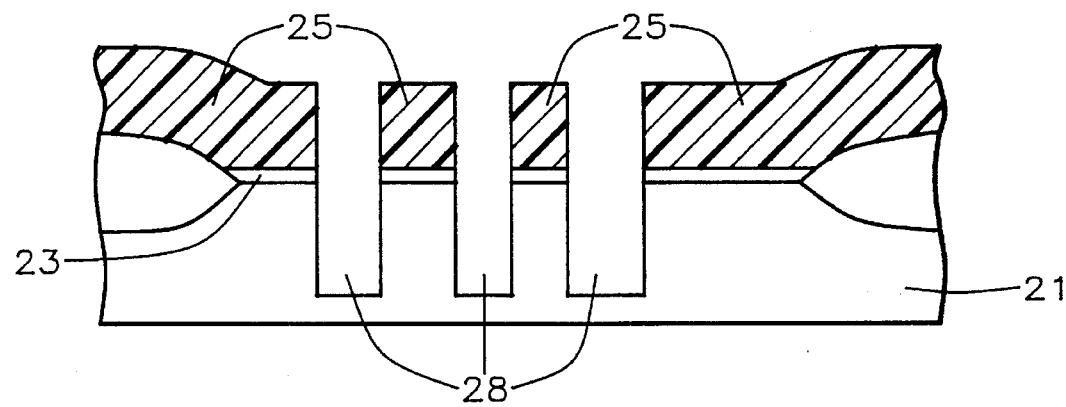
FIG. 13 shows a cross sectional view of the vertical trenches formed in the semiconductor substrate.
Figure 14:
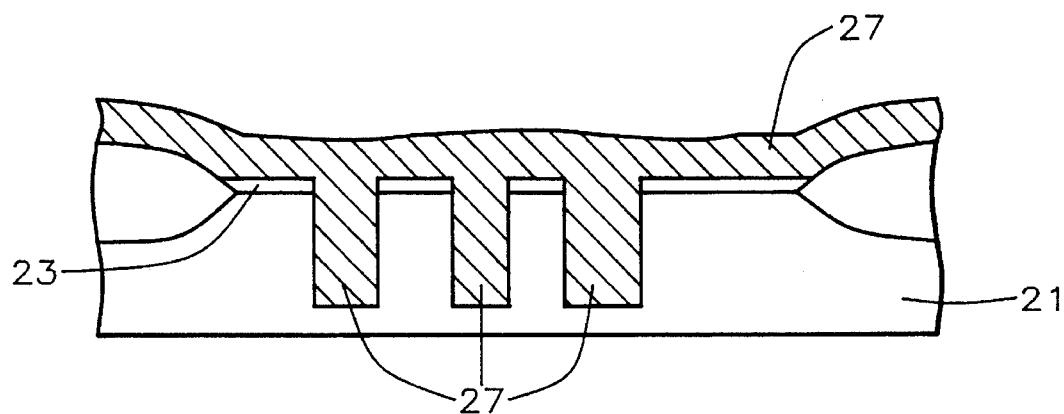
FIG. 14 shows a cross sectional view of the vertical trenches in the semiconductor substrate filled with highly doped polysilicon.

Refer now to FIG. 11 through FIG. 16, there is shown an embodiment of a method of forming the polysilicon trench device. FIG. 11 shows a barrier dielectric layer 23 of silicon dioxide having a thickness between about 100 and 600 Angstroms formed on a silicon substrate 21. As shown in FIG. 12, a layer of photoresist 25 with openings formed for source and drain is formed on the surface of the barrier dielectric layer 23. As shown in FIG. 13, trenches 28 are then etched through the barrier dielectric 23 in to the silicon substrate 21 through the source and drain openings in the photoresist 25 using anisotropic etching. The trenches are between about 0.2 and 1.0 microns wide and between about 0.5 and 5.0 microns deep. As shown in FIG. 14, the photoresist is removed and the trenches are filled with highly doped polysilicon 27 by means of Low Pressure Chemical Vapor Deposition or Spin On Glass. Highly doped polysilicon 27 will also be formed on the surface of the barrier dielectric layer 23. The polysilicon doping level is sufficient to provide polysilicon resistivity less than 100 ohms per square for either N or P type polysilicon. For an n type silicon substrate P type polysilicon is used and for a P type silicon substrate N type polysilicon is used. The polysilicon is then annealed at a temperature of between about 700° C. and 900° C. for between about 10 and 30 minutes.

Figure 15:
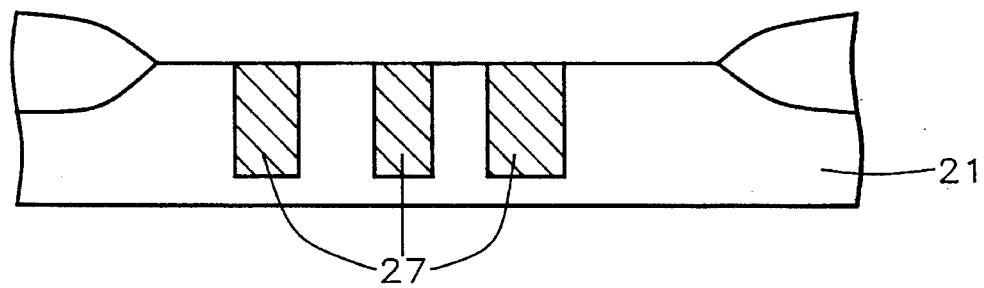
FIG. 15 shows a cross sectional view of the buried polysilicon trench device after removal of the dielectric barrier layer.
Figure 16:
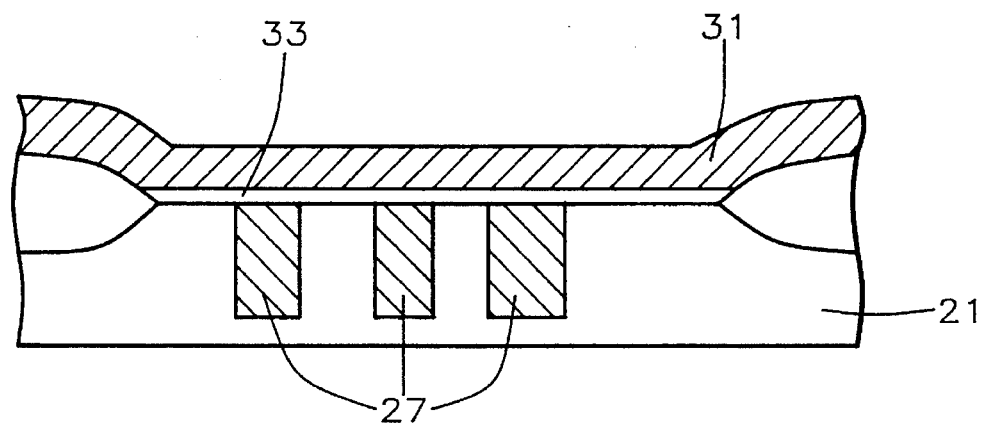
FIG. 16 shows a cross sectional view of the buried polysilicon trench device after forming the polysilicon gate.

As shown in FIG. 15, the highly doped polysilicon and barrier dielectric are removed from the surface of the substrate by etching leaving the trenches filled with highly doped polysilicon 27. As shown in FIG. 16, a gate oxide 33 with a thickness between about 50 and 200 Angstroms is then formed over the area of the trenches and a polysilicon gate electrode 31 is formed on the gate oxide.

While the invention has been particularly shown and described with reference to the preferred embodiments thereof, it will be understood by those skilled in the art that various changes in form and details may be made without departing from the spirit and scope of the invention.

What is claimed is:

1. A method of forming a trench device, comprising the steps of:

providing a semiconductor substrate;

forming a barrier dielectric layer on the surface of said semiconductor substrate;

forming a layer of photoresist with openings for source and drain regions in said layer of photoresist on said barrier dielectric layer;

forming vertical trenches in said semiconductor substrate through said openings in said layer of photoresist wherein each of said vertical trenches has a top, a bottom, and sidewalls;

removing remaining said layer of photoresist;

filling said vertical trenches with doped polysilicon wherein said doped polysilicon contacts said sidewalls of said vertical trenches;

annealing said doped polysilicon and said sidewalls of said vertical trenches;

removing said barrier dielectric layer on said surface of said semiconductor substrate;

forming a gate dielectric layer on said surface of said semiconductor substrate wherein said gate dielectric layer covers said tops of said vertical trenches;

forming a gate electrode layer on said gate dielectric layer; and forming a gate electrode pattern in said gate dielectric layer.

2. The method of claim 1 wherein said each of said vertical trenches is between about 0.5 and 1.0 microns wide and between about 0.5 and 5.0 microns deep.

3. The method of claim 1 wherein said gate dielectric layer is formed of silicon dioxide.

4. The method of claim 1 wherein said gate electrode layer is formed of polysilicon.

5. The method of claim 1 wherein the minimum distance between said sidewalls of adjacent said vertical trenches is about 0.1 microns.

6. The method of claim 1 wherein said barrier dielectric layer is an oxide.

7. A method of forming a trench device, comprising the steps of:

providing a semiconductor substrate;

forming a barrier dielectric layer on the surface of said semiconductor substrate;

forming a layer of photoresist with openings for source and drain regions in said layer of photoresist on said barrier dielectric layer;

forming vertical trenches in said semiconductor substrate through said openings in said layer of photoresist wherein each of said vertical trenches has a top, a bottom, and sidewalls;

removing remaining said layer of photoresist;

forming a layer of doped polysilicon having a thickness of between about 500 and 2000 Angstroms on said sidewalls of said vertical trenches;

filling the remainder of said vertical trenches with a filler dielectric;

annealing said doped polysilicon and said sidewalls of said vertical trenches;

removing said barrier dielectric layer on said surface of said semiconductor substrate;

forming a gate dielectric layer on said surface of said semiconductor substrate wherein said gate dielectric layer covers said tops of said vertical trenches;

forming a gate electrode layer on said gate dielectric layer; and forming a gate electrode pattern in said gate dielectric layer.

8. The method of claim 7 wherein said filler dielectric is silicon dioxide.

9. The method of claim 7 wherein said each of said vertical trenches is between about 0.5 and 1.0 microns wide and between about 0.5 and 5.0 microns deep.

10. The method of claim 7 wherein said gate dielectric layer is formed of silicon dioxide.

11. The method of claim 7 wherein said gate electrode layer is formed of polysilicon.

12. The method of claim 7 wherein the minimum distance between said sidewalls of adjacent said vertical trenches is about 0.1 microns.

13. The method of claim 7 wherein said barrier dielectric layer is an oxide.

* * * * *